(12) United States Patent
Bolken

(10) Patent No.: US 7,247,521 B2
(45) Date of Patent: Jul. 24, 2007

(54) SEMICONDUCTOR ASSEMBLY ENCAPSULATION MOLD AND METHOD FOR FORMING SAME

(75) Inventor: Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/919,373

(22) Filed: Aug. 17, 2004

(65) Prior Publication Data

US 2005/0012227 A1 Jan. 20, 2005

Related U.S. Application Data

(60) Continuation of application No. 10/421,910, filed on Apr. 24, 2004, now Pat. No. 6,841,424, which is a division of application No. 09/766,654, filed on Jan. 23, 2001, now Pat. No. 6,734,571.

(51) Int. Cl.
*H01L 21/44* (2006.01)

(52) U.S. Cl. .................... 438/112; 438/125; 438/126; 438/127; 257/E23.128; 257/E21.502

(58) Field of Classification Search .............. 438/112, 438/113, 125–127; 257/724, 730, 787–789, 257/793, E23.123, E23.128, E21.502
See application file for complete search history.

(56) References Cited

U.S. PATENT DOCUMENTS 5,214,846 A 6/1993 Asami et al.
6,081,978 A 7/2000 Utsumi et al.
6,173,490 B1 * 1/2001 Lee et al. ................. 29/841
6,184,465 B1 2/2001 Corisis
6,344,162 B1 * 2/2002 Miyajima ............ 264/272.14
6,541,310 B1 * 4/2003 Lo et al. .................. 438/122
6,734,571 B2 5/2004 Bolken
2002/0014693 A1 2/2002 Pollock
2002/0027010 A1 * 3/2002 Glenn .................... 174/52.2

FOREIGN PATENT DOCUMENTS

JP 11-87433 A 3/1999

* cited by examiner

*Primary Examiner*—Kenneth Parker
*Assistant Examiner*—Matthew E. Warren
(74) *Attorney, Agent, or Firm*—Dickstein Shapiro LLP

(57) ABSTRACT

An encapsulation mold for forming an encapsulation layer over a semiconductor assembly is disclosed. A semiconductor assembly with multiple semiconductor dies secured to a single semiconductor support structure is inserted into an encapsulation mold. The mold contains a first section and a second section, which form a cavity around the assembly. The mold contains an aperture for transferring encapsulating material into the mold cavity. One of the mold sections has a design feature, such as a raised rib or groove interconnecting at approximately the separation or saw-cut regions of the individual dies of the assembly. Encapsulation material is inserted into the mold cavity until the cavity is filled. The mold section design feature shapes the top surface of the encapsulation layer. The mold is removed leaving the exterior surface of the encapsulation layer patterned with the design feature. The assembly is then separated into individual dies along the design feature boundary of the encapsulation layer's exterior surface.

6 Claims, 4 Drawing Sheets

SEMICONDUCTOR ASSEMBLY ENCAPSULATION MOLD AND METHOD FOR FORMING SAME

CROSS REFERENCE TO RELATED APPLICATIONS

This application is a continuation of U.S. patent application Ser. No. 10/421,910, filed on Apr. 24, 2004 now U.S. Pat. No. 6,841,424, which is a divisional of U.S. patent application Ser. No. 09/766,654, filed on Jan. 23, 2001, now U.S. Pat. No. 6,734,571, the disclosures of which are incorporated by reference herein.

BACKGROUND OF THE INVENTION

The invention relates to a semiconductor die assembly encapsulation mold and to a method of forming an encapsulation mold.

DESCRIPTION OF RELATED ART

Multiple semiconductor dies are often encapsulated together in a single encapsulation mold. Multiple semiconductor dies are secured to a single semiconductor die support structure to form a multiple semiconductor die assembly. The dies are then electrically connected, usually by bondwires, to bond pads of the support structure. The assembly is then placed in an encapsulation mold With a first and a second section that join to form a mold cavity. An encapsulation material is inserted into the mold cavity covering the assembly. The assembly is removed from the mold and the assembly is separated or cut, usually by saw cutting, into individual molded semiconductor dies by cutting through the encapsulation material and the support structure.

FIG. 1 is a top view of a conventional multiple semiconductor die assembly 100 after encapsulation and before the semiconductor dies 30 are separated into individual dies 30 along dashed lines 50. FIG. 2 is a cross-sectional view of FIG. 1 taken at line II—II. The dies 30 are shown secured to the top surface 22 of a semiconductor die support structure 20 such as, for example, a thin printed circuit film or board. There are many well known techniques for securing the dies 30 to the support structure 20, such as die paste. FIGS. 1 and 2 illustrate an assembly 100 of six dies 30 mounted on a single support structure 20. After the semiconductor dies 30 are mounted various electrical connections 31, such as wire bonds, are made between the dies 30 and the support structure 20. The dies 30 and the support structure top surface 22 are covered with an encapsulation material to form an encapsulation layer 40 which has a top surface 42 and sidewalls 43 supported by the support structure's top surface 22. The encapsulation layer can be formed by using an encapsulation mold as described in FIG. 3.

FIG. 3 illustrates a conventional encapsulation mold 200 for forming the encapsulated assembly 100 of FIGS. 1 and 2. The dies 30 secured on a support structure 20 are placed inside the encapsulation mold 200. A conventional encapsulation mold 200 consists of two sections, a base section 60 and a top section 61. The base section 60 and top section 61 are secured to each other along a shared perimeter 63 by various means well know in the art. The two sections 60, 61, when secured, form a mold cavity 64. The mold 200 contains an aperture 62 for transferring encapsulation material into the mold cavity 64. The base section 60 is shown secured against the support structure's bottom surface 21 so that the encapsulation material does not extend past the perimeter 23 of the support structure 20. The encapsulating material is conventionally injected through the aperture 62 under pressure until the mold cavity 64 is filled. Conventional encapsulating material 40 include various plastics and resins such as various molded epoxy compounds.

After the encapsulation layer 40 is formed, the mold 200 is removed. Various electrical contacts, such as fine ball grid arrays 36 (FIG. 2) formed on the support structure's bottom surface 24, can be formed on the assembly 100 after encapsulation. Dashed lines 50 of FIGS. 1 and 2 outline the regions where the assembly is cut or singularized into individual packaged dies 30. A conventional method is to saw cut the assembly 100 along the dashed lines 50, with the saw entering the assembly 100 from the encapsulation layer's top surface 42. However one drawback of conventional assembly 100 is that the encapsulating layer 40 often crumples, chips or is otherwise damaged in the separation region 50 during the separation or cutting phase. Uneven or non-uniform surfaces can be created as a result of the separation process.

Another drawback is that the encapsulating layer 40 quickly dulls the cutting blade, so that a thick encapsulation layer 40 slows the singulation process. A third drawback of the conventional method is that the encapsulating layer 40 typically has a different coefficient of thermal expansion than the support structure 20 which may cause the support structure's perimeter 23 to curl up or bow toward the encapsulation layer's top surface 42. If the support structure 40 bows, it can make the assembly 100 separation process very difficult and result in non-uniform individual die packages 30. The bowing can also interfere with various electrical contacts formed on the assembly 100 after encapsulation, such as the fine ball grid array 36 shown in FIG. 2.

Accordingly, it is desirable to provide an encapsulation mold and a method of encapsulating semiconductor assemblies which makes it easier to separate the molded assembly into uniformly shaped individual packaged dies and which reduces the tendency of the assembly's support structure to bow upwards. It is also desirable to improve the uniformity among separated packaged semiconductor dies, reduce the cost and complexity of fabricating packaged semiconductor dies, and reduce damage to the encapsulation layer during die separation.

SUMMARY OF THE INVENTION

The invention addresses some of the drawbacks of conventional semiconductor assembly encapsulation molds as well as problems associated with the encapsulation layer during die separation. A semiconductor assembly including multiple semiconductor dies secured to a single semiconductor support structure are inserted into an encapsulation mold comprising a first mold section and a second mold section. The two sections when secured together form a mold cavity. The second mold section has a design feature which provides an exterior surface molded feature in the molded assembly which facilitates cutting of the encapsulation layer during singulation of the packaged dies. The design feature may be an interconnected continuous groove or interconnected raised rib provided along the interior surface of the mold cavity at die singulation locations.

An encapsulation layer is formed for the assembly using the encapsulation mold with the design feature. Encapsulating material is transferred into the mold until the mold cavity is filled. The encapsulation layer's exterior surface is shaped according to the design feature of the mold. The semiconductor assembly is then removed from the mold and the individual dies are separated from each other by cutting the encapsulation layer and support structure along lines of the encapsulation layer's exterior surface design feature shaped by the interior design feature of the mold.

In one exemplary embodiment, the mold's design feature is a interconnected cavity formed on the interior surface of the mold and projecting out from the main mold cavity. The resulting encapsulation layer's exterior surface has an interconnected raised ribbed along the separation regions of the dies. In another exemplary embodiment, an encapsulation mold has an interior surface of a interconnected projecting rib design feature projecting into the mold cavity. The resulting encapsulation layer's exterior surface has an interconnected grove or cavity along the separation regions of the dies.

These and other advantages and features of the invention will be more clearly understood from the following detailed description of the invention which is provided in connection with the accompanying drawings.

DETAILED DESCRIPTION OF PREFERRED EMBODIMENTS

In the following detailed description, reference is made to various exemplary embodiments of the invention. These embodiments are described with sufficient detail to enable those skilled in the art to practice the invention, and it is to be understood that other embodiments may be employed, and that structural changes or variations may be made without departing from the spirit or scope of the present invention.

Figure 1:
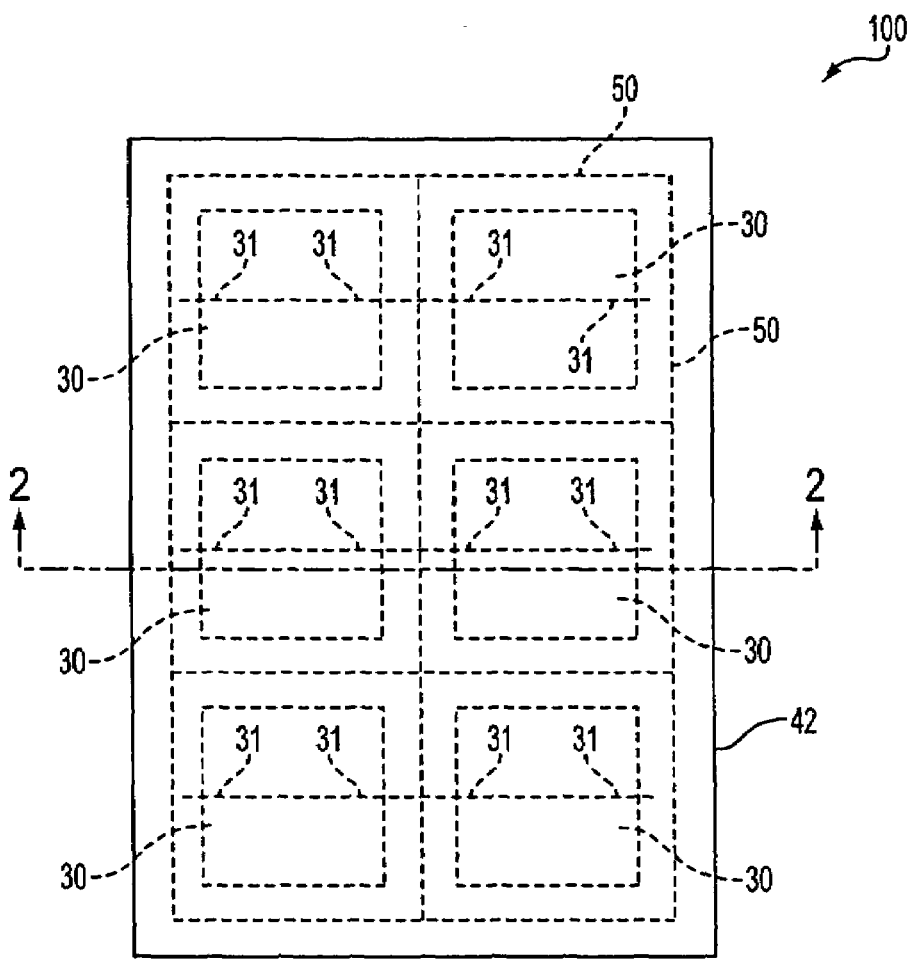
FIG. 1 is top view of a conventional semiconductor assembly after encapsulation but prior to singularizing the assembly.
Figure 2:
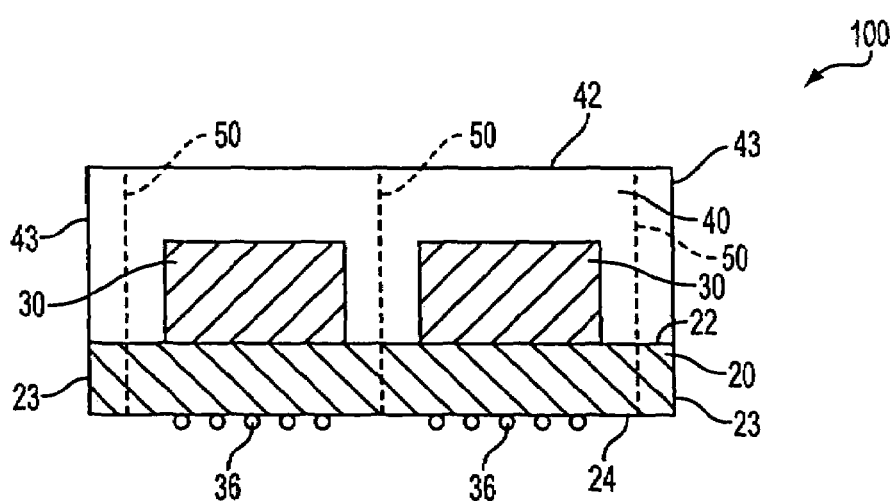
FIG. 2 is a cross sectional view of FIG. 1 at line II—II.
Figure 3:
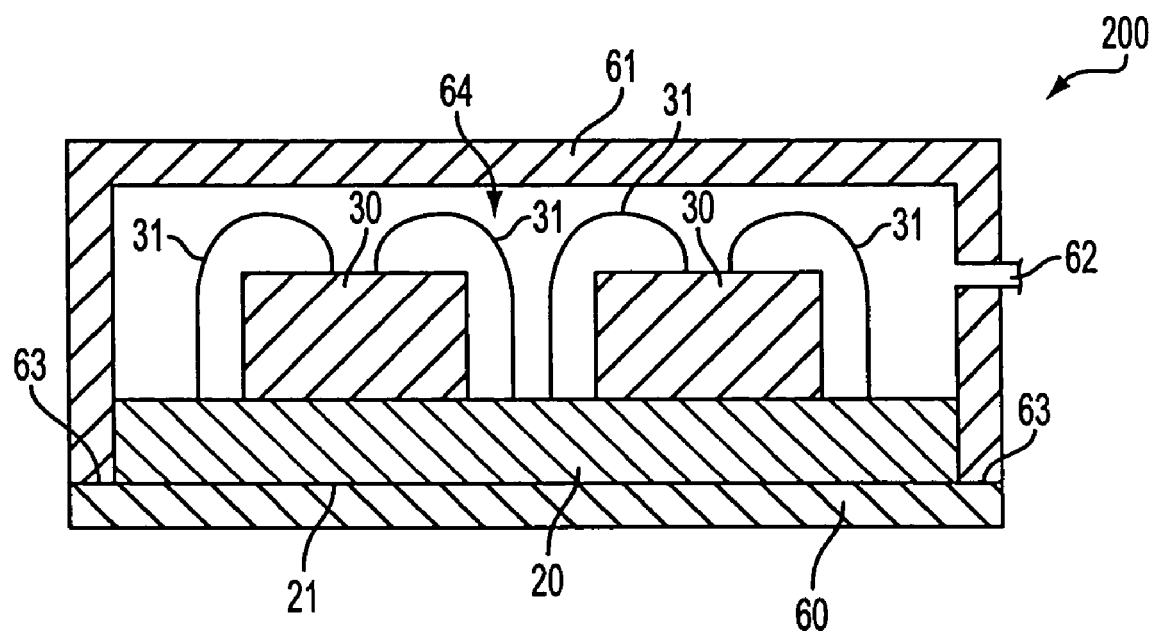
FIG. 3 is a cross-sectional view of a conventional semiconductor assembly inside an encapsulation mold prior to encapsulation.
Figure 4:
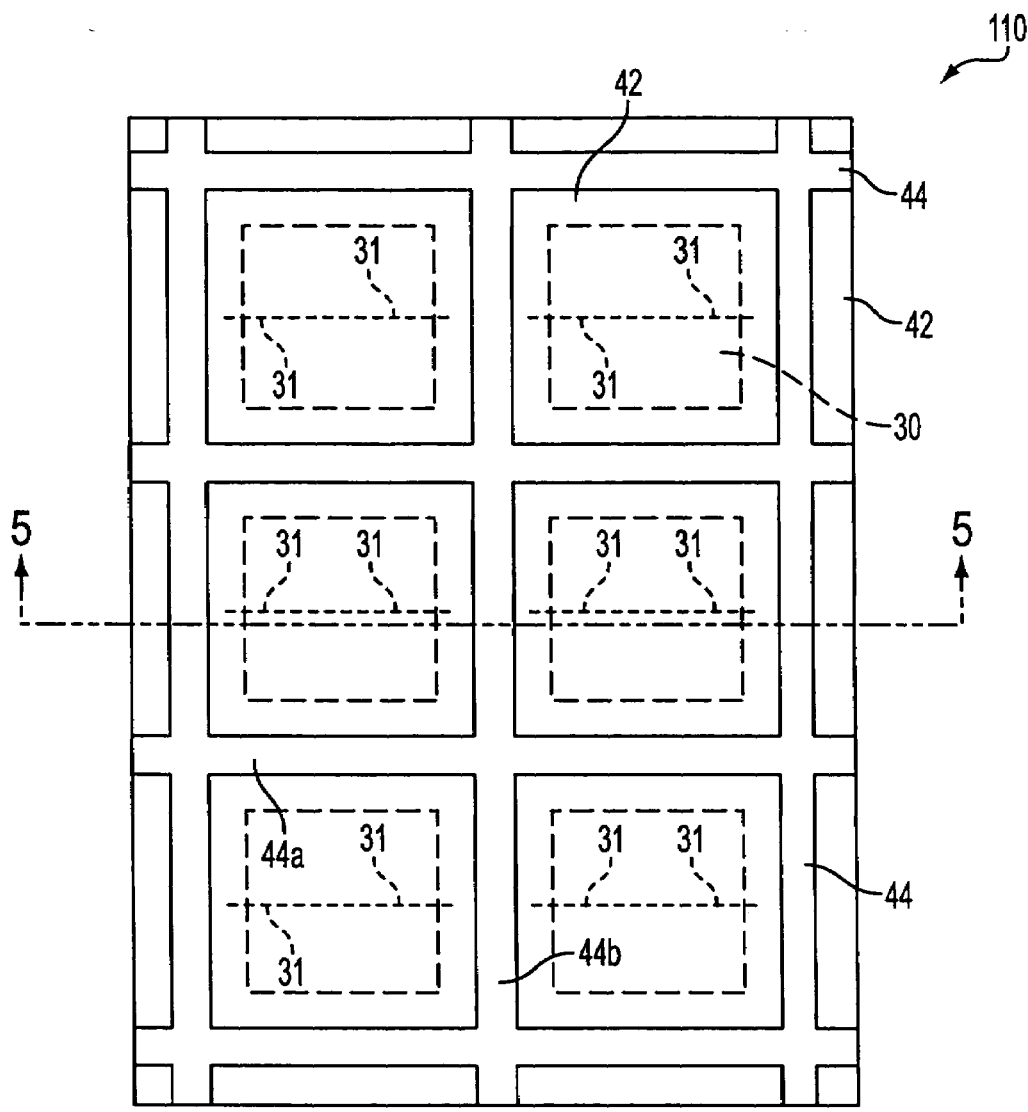
FIG. 4 is a top view of a semiconductor assembly of the invention after encapsulation according to a method of the invention prior to singularizing the semiconductor assembly.
Figure 5:
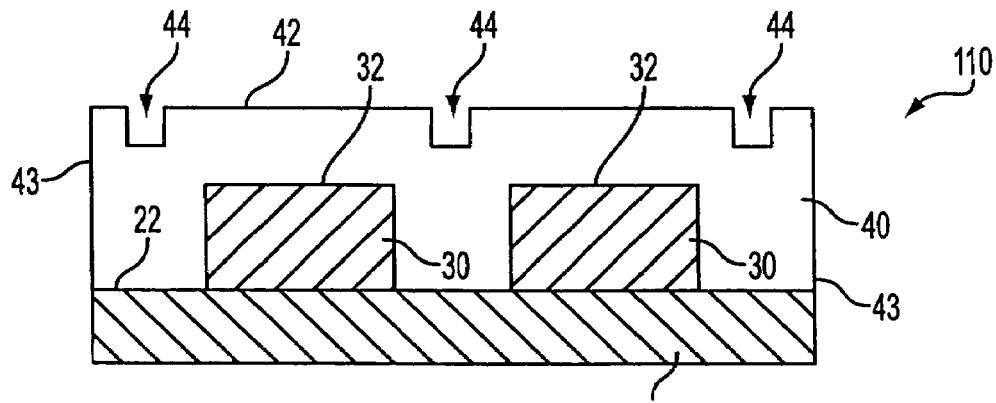
FIG. 5 is a cross-sectional view of FIG. 4 taken at line V—V.

FIGS. 4 and 5 illustrate a first exemplary embodiment of the invention. FIG. 4 is a top view of a semiconductor assembly 110 formed using an encapsulation mold 210 of the invention shown in FIG. 6. FIG. 5 is a cross-sectional view of FIG. 4 taken at line V—V. The assembly 110 has an encapsulation layer 40 that is supported by the die's top surface 32 and the support structure's top surface 22. The encapsulation layer 40 has a top surface 42 with a design feature 44 formed as rows and columns of connected feature stripes 44a, 44b located along the approximate separation region of each die 30. The design feature 44 is located between the dies 30 in both a horizontal and vertical direction as viewed in FIG. 4 and at the assembly's perimeter 43. The design feature 44 is formed based on the interior shape of the encapsulation mold 210 shown in FIG. 6.

Figure 6:
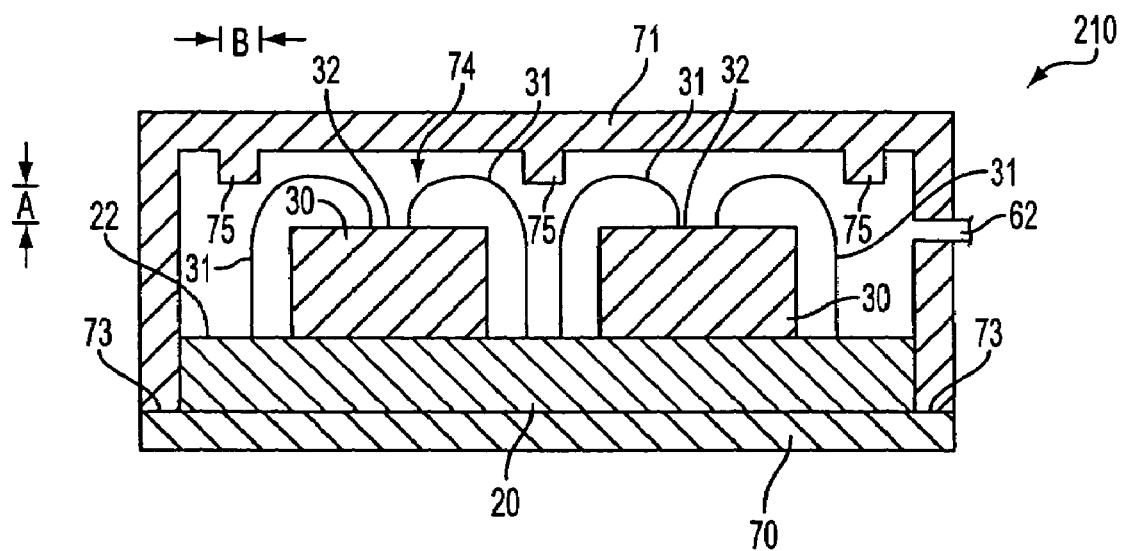
FIG. 6 is a cross-sectional view of a semiconductor assembly encapsulation mold with an inteconnected groove pattern formed according to the invention.

The assembly 110 is formed by placing a support structure 20 with dies 30 into the FIG. 6 encapsulation mold 210. The mold 210 consists of a first section 70 and a second section 71. The two sections 70, 71 are secured along perimeter 73 to form a mold cavity 74. The mold 210 can be made of any material suitable for encapsulating semiconductor assemblies 200 such as various metals, glass, ceramics, plastics, and fiberglass among others. There are well known mold materials used for forming the mold 210.

The second mold section 71 contains a design feature 75 that projects into the mold cavity 74 to form an interconnected cavity on the encapsulation layer exterior surface. The mold design feature 75 can be any suitable dimension, width, length, or width based on the design or shape of the semiconductor assembly 110. Preferably the design feature 75 has a width B of 0.15 microns or greater. The depth A of the mold design feature 75 is only limited by moveability of the encapsulating material throughout the mold cavity 74. Sufficient clearance for the encapsulating material must be allowed to completely fill the cavity 74. Exemplary ranges for depth A of the design feature is about 10 microns or greater between the perimeter of the design feature 75 and the top of the dies 32. It is to be understood that the design feature 75 can take many shapes and formed to include sloped, curved, or angled sidewalls. What is important is that the resulting, encapsulation layer 40 have areas of reduced thickness in the assembly separation region to improve the separation of the dies 30.

Figure 7:
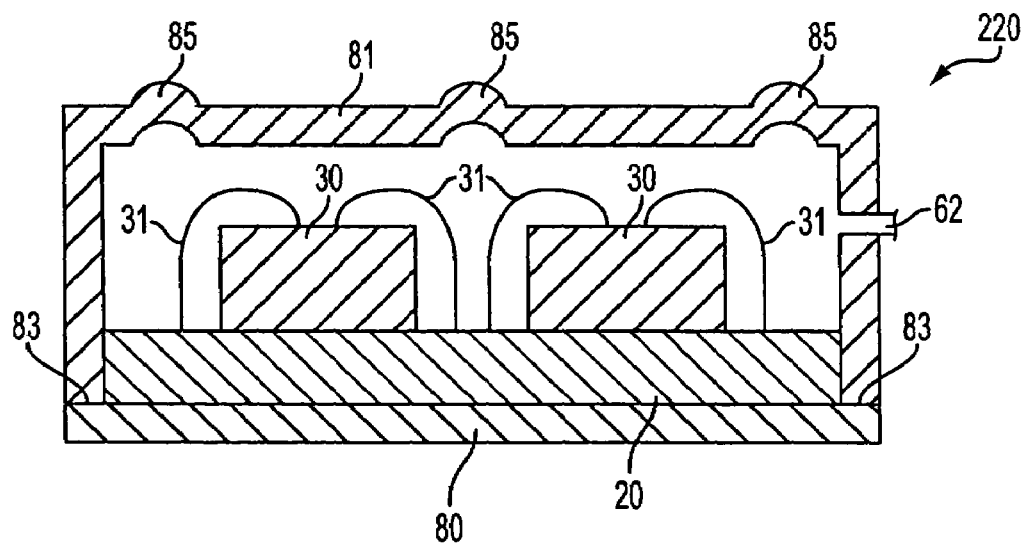
FIG. 7 is a cross-sectional view of a semiconductor assembly encapsulation mold with an inteconnected raised rib pattern formed according to the invention.

FIG. 7 illustrates another exemplary encapsulation mold 220 formed in accordance with the invention. An encapsulation mold 220 with a design feature 85 of an interconnected raised rib throughout the interior surface of the second mold section 81 is shown. The design feature 85, provides extra encapsulating material along the exterior surface of the encapsulation layer 40 in the die 30 separation regions. The raised rib design feature 85 helps prevent the support structure 20 from bowing upwards toward the semiconductor dies 30 during expansion and contraction of the encapsulation layer 40. A semiconductor assembly (not shown) can be formed using encapsulation mold 220 to have a raised rib design feature formed as rows and columns of interconnected ribs along the encapsulation layer's 40 exterior surface in approximately the regions where the assembly will be separated into individual dies 30. As described above, the assembly can be saw cut or singularized using techniques well known in the art along the raised ribs of the molded assembly. It is to be understood that the mold's design feature 85 can take various shapes to include sloped, curved, or angled surfaces. Preferable widths for the raised rib design feature 85 are 10 microns or greater.

Hating thus described in detail the exemplary embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of embodiments which can achieve the features and advantages of the present invention. It is not intended that the invention be limited to the embodiments shown and described in detail herein. The invention is only limited by the scope of the following claims.

What is claimed is:

1. A method of encapsulating a semiconductor assembly comprising:
   providing a semiconductor assembly comprising a semiconductor die support structure having a plurality of semiconductor dies;
   placing said semiconductor assembly into an encapsulation mold, said mold having an interior surface, said interior surface having a design feature which produces a complementary design feature in an exterior surface in an encapsulation layer of said semiconductor assembly at locations between said plurality of dies; and
   transferring an encapsulating material into a cavity formed by said mold interior surface,
   wherein said mold interior surface has raised design features which form cavities in said encapsulating material at locations between said plurality of dies of said semiconductor assembly, said cavities extending from the exterior surface of the encapsulation layer to a depth that is elevationally above the dies.

2. A method of encapsulating a semiconductor assembly comprising:
   providing a semiconductor assembly comprising a semiconductor die support structure having a plurality of semiconductor dies;
   placing said semiconductor assembly into an encapsulation mold, said mold having an interior surface, said interior surface having a design feature which produces a complementary design feature in an exterior surface in an encapsulation layer of said semiconductor assembly at locations between said plurality of dies; and
   transferring an encapsulating material into a cavity formed by said mold interior surface,
   wherein said mold interior surface has recessed design features which form raised structures in said encapsulating material at locations between said plurality of dies of said semiconductor assembly.

3. A method of forming an encapsulated semiconductor assembly comprising:
   forming a mold having an interior surface which defines a mold cavity, said interior surface having a design feature;
   placing a semiconductor assembly having a plurality of dies into said mold cavity;
   introducing an encapsulating material into said mold cavity, whereby said interior surface design feature produces a complementary design feature in said encapsulating material at locations between said plurality of dies of said semiconductor assembly,
   wherein said interior surface design feature has one of a raised design feature or a recessed design feature, whereby the raised design feature forms a cavity extending from an exterior surface of the encapsulating material to a depth that is elevationally above the dies and the recessed design feature produces a raised structure in said encapsulating material.

4. The method according to claim 3, further comprising using said complementary design feature to separate said semiconductor assembly into said plurality of dies.

5. The method according to claim 3, wherein said interior surface design feature is a raised design feature.

6. The method according to claim 3, wherein said interior surface design feature is a recessed design feature.

* * * * *